United States Patent
Casagrande

(10) Patent No.: US 6,326,850 B1
(45) Date of Patent: Dec. 4, 2001

(54) HIGH FREQUENCY SIGNAL GENERATOR FROM A HOROLOGICAL TIME BASE

(75) Inventor: Arnaud Casagrande, Lignières (CH)

(73) Assignee: Asulab S.A., Bienne (CH)

( * ) Notice: Subject to any disclaimer, the term of this patent is extended or adjusted under 35 U.S.C. 154(b) by 0 days.

(21) Appl. No.: 09/441,745

(22) Filed: Nov. 17, 1999

(30) Foreign Application Priority Data

Nov. 27, 1998 (EP) .................................................. 98122443

(51) Int. Cl.[7] .............................. H03L 7/06; H03L 7/089; H03L 7/107; H03L 7/18
(52) U.S. Cl. .................................. 331/17; 331/8; 331/10; 331/DIG. 2; 331/18; 331/16; 331/25
(58) Field of Search ....................... 331/8, 10, 11, 331/14, 16–18, 25, DIG. 2; 327/156–159; 375/376; 455/200

(56) References Cited

U.S. PATENT DOCUMENTS

| | | | |
|---|---|---|---|
| 4,419,770 | * 12/1983 | Yagi et al. | 455/301 |
| 4,521,744 | * 6/1985 | Yamada et al. | 331/1 A |
| 4,926,141 | * 5/1990 | Herold et al. | 331/16 |
| 5,068,626 | * 11/1991 | Takagi et al. | 331/17 |
| 5,194,828 | 3/1993 | Kato et al. | 331/1 A |
| 5,384,551 | 1/1995 | Kennedy et al. | 331/17 |
| 5,428,829 | 6/1995 | Osburn et al. | 455/197.1 |
| 5,448,598 | * 9/1995 | Yousefi et al. | 375/376 |

FOREIGN PATENT DOCUMENTS 0 595 377 A1   5/1984   (EP) .

OTHER PUBLICATIONS

Patent Abstract of Japan vol. 005, No. 163 (E–078), Oct. 20, 1981 & Jp 56 093403 A (Seiko Epson Corp.), Jul. 29, 1981, Abstract.

* cited by examiner

*Primary Examiner*—David Mis
(74) *Attorney, Agent, or Firm*—Griffin & Szipl, P.C.

(57) ABSTRACT

A generator (50) able to be fitted to a clockwork system including a crystal (51a) used as a time base, includes a first oscillator (51) able to supply a first frequency (f1), a second oscillator (56) able to supply a second frequency (f2), a divider (60) able to supply a third frequency (f3) from the second frequency, a comparator (52) able to compare the third and first frequencies, and a control loop including a filter (54) connected to the comparator and able to control the second oscillator. The generator is characterised in that it includes a component (58) able to provide an indicator (LCK) containing the state of the loop, and in that the filter (54) can receive the indicator (LCK) and, in response, have a narrow (or respectively wide) band, when the loop is (or respectively is not) locked.

17 Claims, 7 Drawing Sheets

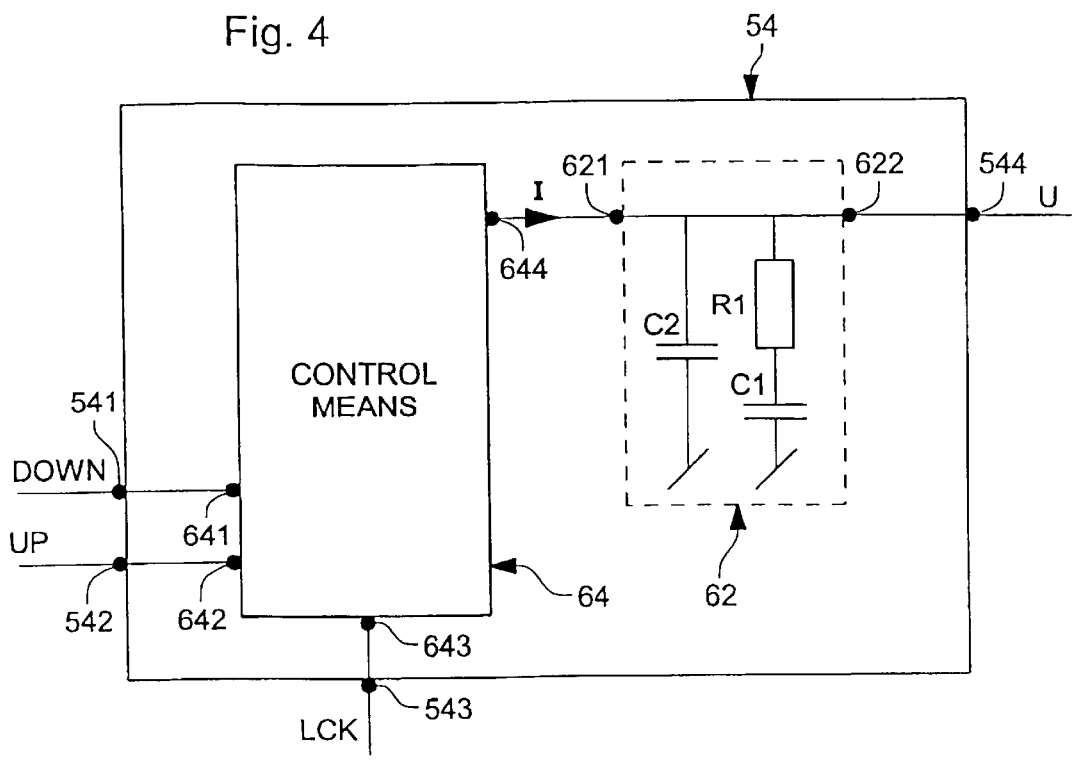
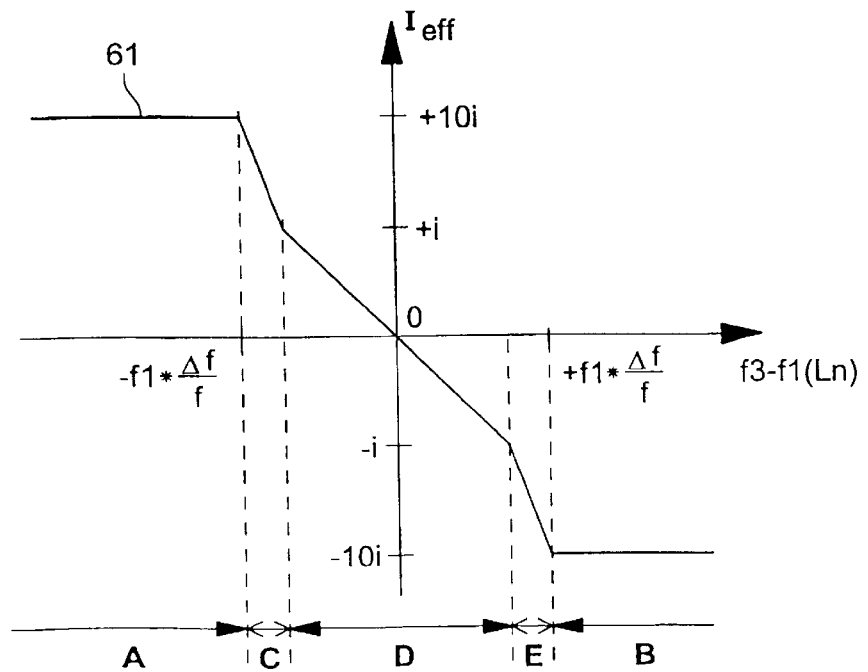

Fig. 5

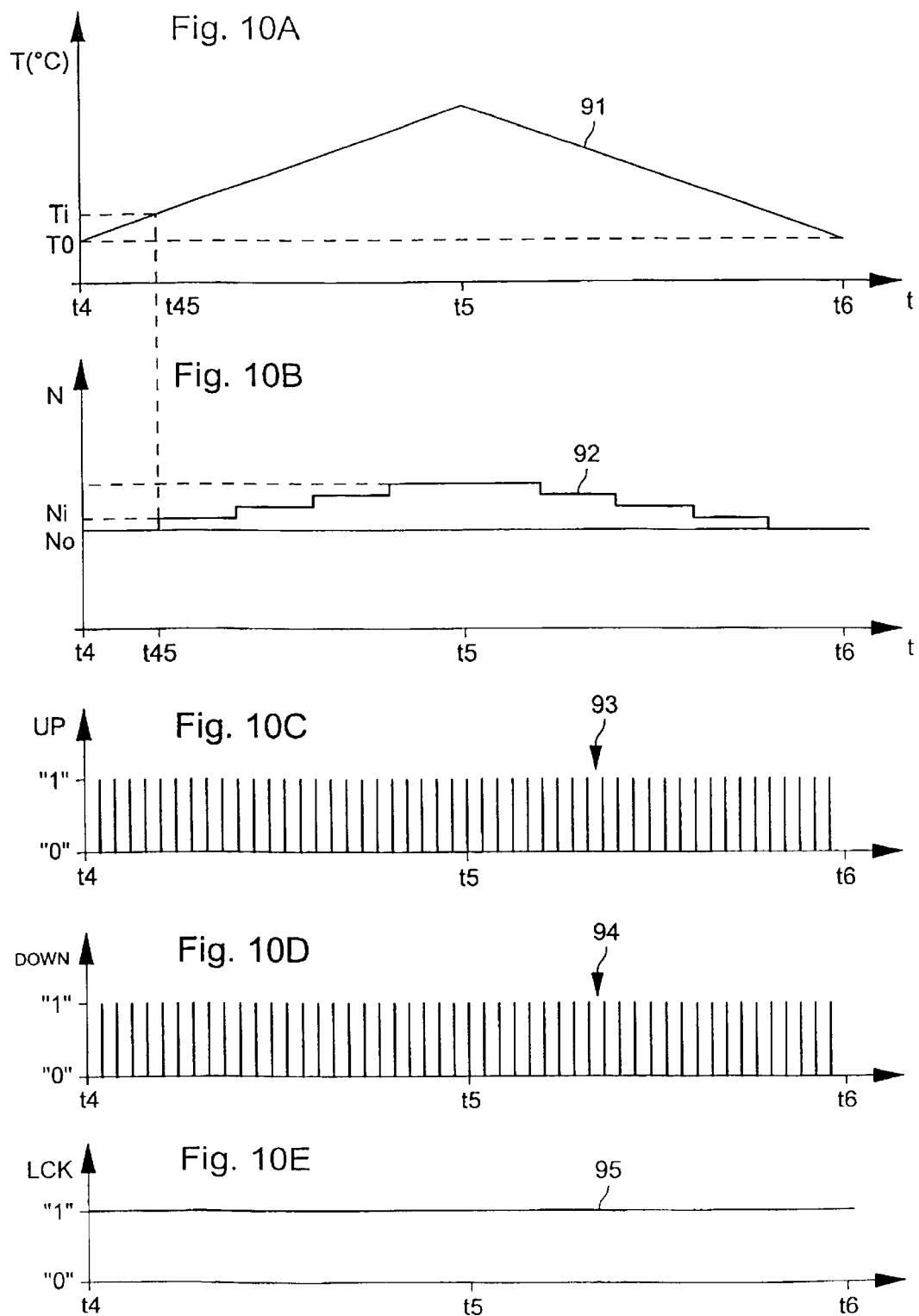

HIGH FREQUENCY SIGNAL GENERATOR FROM A HOROLOGICAL TIME BASE

FIELD OF THE INVENTION

The present invention concerns the technical field of high frequency signal generators.

BACKGROUND OF THE INVENTION

High frequency signal generators are used more and more frequently in electric circuits. The term <<synthesiser>> is also used to describe such generators.

A large number of high frequency signal generators exist in the state of the art concerned. European Patent No. 0 595 377 discloses two types of high frequency synthesis: <<direct>> synthesis and <<indirect>> synthesis.

It will be noted that the present description concerns only generators associated with <<indirect>> synthesis. FIG. 1 of the present description shows a high frequency signal generator 20 which implements <<indirect>> synthesis as described in this document.

Generator 20 includes, connected in series, a voltage controlled oscillator O able to supply a signal Vout having a frequency comprised within a predetermined frequency range, a prescaler (a fixed microwave divider) P, two programmable dividers N and M, a phase and frequency comparator H, and a reference oscillator R formed of a crystal. Generator 20 also includes a phase-locked control loop connected between comparator H and oscillator O, this control loop including an amplifier A and a filter F. The control loop is also arranged so that the frequency of signal Vout is substantially constant and equal to a desired nominal frequency. It is to be noted that dividers N and M are suitably programmed so that the frequency of signal Vout (which is equal to (R/M)*N*P)) corresponds to the desired nominal frequency.

One problem encountered with such a generator is that the real frequency of signal Vout is substantially different to the nominal frequency, particularly because of the instability of the reference oscillator or even under the effect of the ambient temperature. As a result, the difference between the real frequency and the nominal frequency becomes greater than frequency precision required for the generator application, which can be detrimental for applications requiring high frequency precision.

By way of illustration, a generator of this type can form part of a telecommunication system using a narrow band transmission channel, for example in cellular telephones or portable radio-frequency devices. In this case, it is necessary to use a generator supplying a signal whose carrier frequency is defined with great precision, so that the data transfer occurs over a narrow frequency range. Typically, within the scope of such an application, the generator frequency precision must be of the order of several ppm ($10^{-6}$).

One solution to the aforementioned problem consists in using a crystal able to supply an extremely stable and constant low frequency. An <<AT>> type crystal whose frequency precision is of the order of 2 to 10 ppm is commonly used. By way of illustration, FIG. 2 shows a curve 22 illustrating the temperature dependence of the carrier frequency $f_R$ supplied by such an AT crystal. As FIG. 2 shows, a temperature variation $\Delta T$ causes a frequency variation $\Delta f_R$ to the AT crystal, in accordance with a polynomial type function of the order 3 with a linear term and a cubic term. Thus, within a temperature range comprised between 10 and 50° C., the AT crystal can supply frequency $f_R$ substantially equal to 15 MHz, with a precision of the order of 3 KHz (which corresponds to the aforementioned precision of 2 to 10 ppm).

One drawback of using such an AT crystal is that the latter is expensive and has to be supplied at high frequencies, which involves high electric power consumption.

In the event that the generator forms part of a clockwork system including a time base formed by a CT crystal, one drawback of using an AT crystal is that the clockwork system fitted therewith includes two crystals whose low frequency signal supply is redundant. In this case, it would be preferable to use the CT crystal of the time base to form the reference oscillator of the generator, which would allow the number of components of the generator fitted to such a system to be reduced.

However, the fact of using the CT crystal of a clockwork system to form the reference oscillator of a high frequency signal generator has the drawback that the use of the very low frequency of this crystal involves high phase noise over the voltage controlled oscillator frequency spectrum.

Another drawback of such use of the CT crystal is that the frequency precision of this crystal is of the order of 60 ppm ($10^{-6}$), which means that the frequency varies from 30 KHz over a temperature range of 60° C. centred on 25° C., which corresponds to a variation ten times greater than the aforecited precision of an AT crystal (2 to 10 ppm). This is detrimental in the event that the high frequency signal generator is used for transferring data to a transmission channel, as was mentioned hereinbefore.

SUMMARY OF THE INVENTION

One object of the present invention is to provide a high frequency signal generator intended to be fitted to a clockwork system including a time base formed of a CT type crystal, this generator overcoming the aforementioned drawbacks, in particular a generator of this type which is able to supply a signal with a frequency precision lower than 30 Khz.

Another object of the present invention is to provide a high frequency signal generator including a voltage controlled oscillator and a phase-locked control loop, the arrangement of the generator allowing rapid locking of the control loop on the nominal frequency.

Another object of the present invention is to provide a generator of this type which overcomes the drawback that the use of the very low frequency of the CT crystal involves high phase noise over the frequency spectrum of the voltage controlled oscillator.

Another object of the present invention is to provide a high frequency signal generator able to supply a high frequency signal, this supply being independent of the temperature.

Another object of the present invention is to provide a generator of this type which is able to supply a signal with a frequency precision less than 4 Khz.

Another object of the present invention is to provide a high frequency signal generator answering the usual industrial concerns as to space requirement and cost.

These objects, in addition to others are achieved by the high frequency signal generator disclosed herein.

The invention thus concerns a generator of this type characterised in that the reference crystal is formed from a clockwork system crystal, which has the advantage of avoiding the expensive use of an AT type crystal suited to the synthesis of the second frequency.

Another advantage of forming the reference crystal from a clockwork crystal is that it avoids the redundant supply of two low frequency signals in a clockwork system, one being provided by the time base, and the other being provided by the first oscillator, which answers the usual industrial concerns as to cost, space requirement and rationalisation.

Another advantage of forming the reference crystal from the clockwork crystal is that it reduces the number of components of the generator and consequently the electric power consumption, which answers the constant industrial concern of reducing the electric power consumption.

The generator is also characterised in that the filter is arranged to receive an indicator of the state of the control loop and, in response, to be arranged to have the configuration of a narrow-band (respectively wideband) filter, when the control loop is (or is not respectively) locked. One advantage of such an arrangement is that it allows rapid locking of the control loop on the nominal frequency. Indeed, it will be recalled that the narrower (or respectively wider) the filter band, the shorter (respectively longer) the locking time of the control loop.

Another advantage of such an arrangement is that the use of the very low frequency of the clockwork crystal does not involve phase noise over the frequency spectrum of the second oscillator. Indeed, it will be noted that the band width of the filter has an effect on the spectral purity of the second oscillator, since the phase noise of the clockwork crystal is amplified over the second frequency. Conversely, when the filter band is narrow, the reproduction of the noise on the carrier frequency is reduced.

According to another feature of the present invention, the generator further includes a heat compensation device including: a temperature sensor arranged in proximity to the reference crystal for providing a temperature measurement value; and a first memory able to contain a correspondence table between the temperature values and the first division factor values, to receive the measurement value and, in response, to supply the first divider with the first division factor value which, according to the correspondence table, corresponds to the closest temperature value to the measurement value. One advantage of such a heat compensation device is that the supply of the second frequency is independent of the temperature.

Indeed, a variation of 1 of division factor N, means a variation of 4 Khz (i.e. the frequency f4 supplied to the comparator) during comparison of frequency f3.

According to another feature of the present invention, the comparator, the filter, the second oscillator, the first divider and the indicator supply means are made in a monolithic manner in a semi-conductor substrate. One advantage of such an embodiment is that the generator can be formed by a manufacturing process commonly used in the semi-conductor industry.

These objects, features and advantages of the present invention, in addition to others, will appear more clearly upon reading the detailed description of two preferred embodiments of the invention, given by solely by way of example, with reference to the annexed drawings.

BRIEF DESCRIPTION OF THE DRAWINGS

FIG. 4 shows in detail a filter of the generator of FIG. 3;

FIG. 5 shows in detail control means of the filter of FIG. 4;

FIG. 6 shows a curve illustrating the relationship between an efficient current value and a frequency difference;

FIGS. 10A–10E show five timing diagrams associated with the operation of the generator of FIG. 7.

DESCRIPTION OF THE INVENTION

Figure 3:
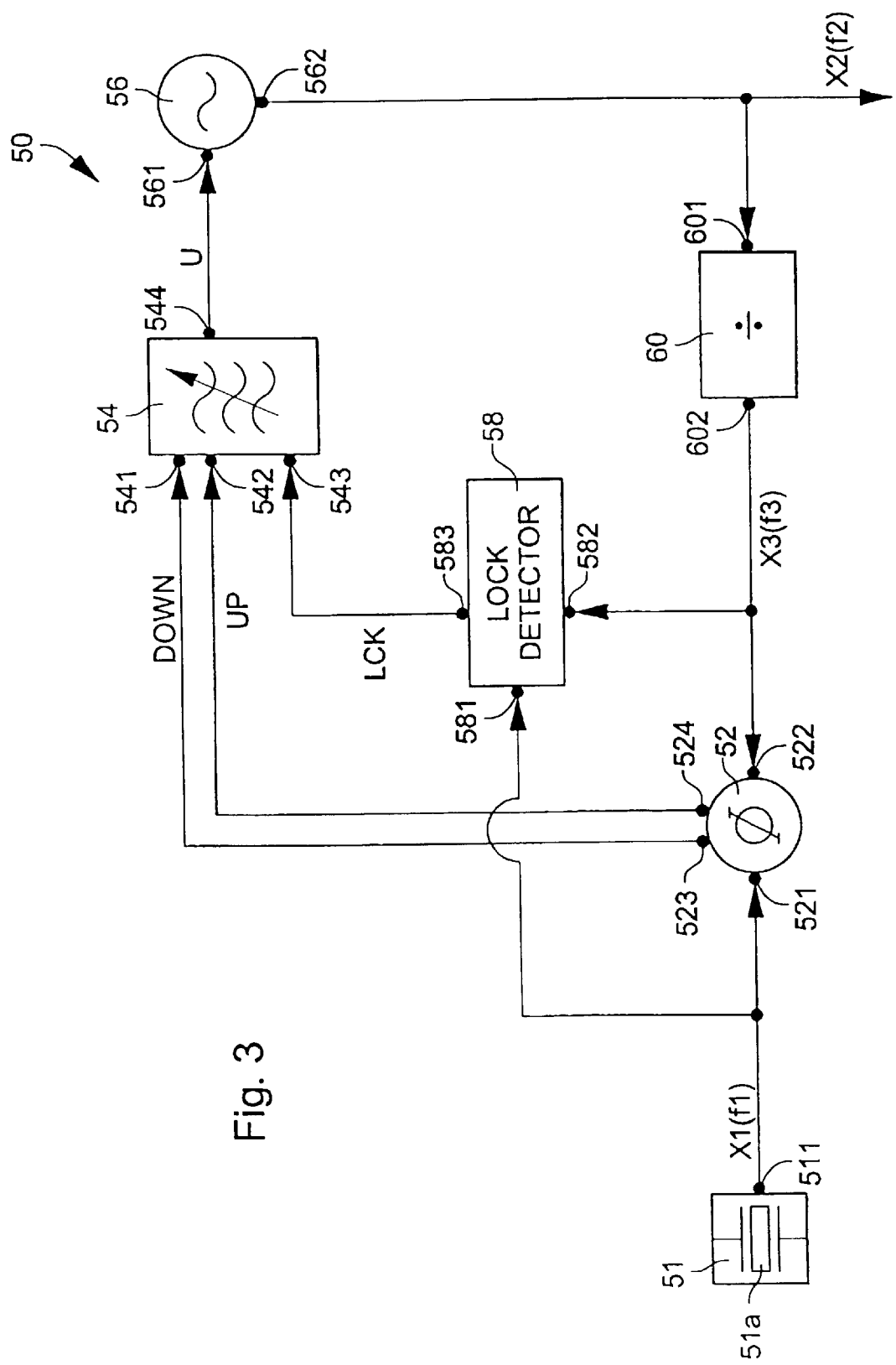
FIG. 3 shows a first preferred embodiment of a high frequency signal generator according to the present invention.

FIG. 3 shows a first preferred embodiment of a high frequency signal generator according to the present invention, this generator being designated by the reference 50.

Generator 50 is intended to be fitted to a clockwork system (not shown in FIG. 3) including a crystal 51$a$ used as time base, this crystal being able to supply a signal X1 at a low frequency f1. Typically, crystal 51$a$ is preferably made by using a CT type crystal able to supply a carrier frequency (i.e. frequency f1) equal to 32768 Hz, such a crystal being commonly called a <<clockwork crystal>> in the horological field.

Generator 50 is arranged to supply, from signal X1, a signal X2 at a high frequency f2 substantially equal to a predetermined nominal frequency f0 (for example 434 MHz). In the following description, it will be noted that the expression <<substantially equal to>> is linked to two distinct notions: frequency precision and resolution. By way of example, the frequency precision (designated $\Delta f/f$) of generator 50 is selected to be equal to 0.25 ppm. Thus, frequency f2 is comprised between f0 $(1-\Delta f/f)$ and f0 $(1+\Delta f/f)$, which defines a frequency range within which frequency f2 is called <<substantially equal>> to nominal frequency f0. The resolution of generator 50 will be described hereinafter.

As FIG. 3 shows, generator 50 includes, connected in series: a voltage controlled oscillator, or second oscillator 56, able to supply signal X2 having the frequency f2 comprised within the predetermined frequency range, a prescaler (a fixed microwave divider) 60, a frequency comparator 52, and a reference oscillator, or first oscillator 51. Generator 50 also includes a phase-locked control loop connected between comparator 52 and oscillator 56, this control loop including a filter 54 and means 58 for supplying the state of the control loop.

Oscillator 56 is arranged to receive a control voltage U provided by filter 54 and, in response, to supply signal. X2 at frequency f2, this latter being variable and depending upon control voltage U, as is described hereinafter. For this purpose, oscillator 56 includes a control terminal 561, for receiving control voltage U, and an output terminal 562, for supplying signal X2 at frequency f2.

Preferably, oscillator 56 is made using a voltage controlled oscillator (VCO) such as that sold on the market by Murata under the reference MQE744-430. It will be recalled that the frequency of a signal supplied by such an oscillator is controlled by a variable direct current (DC) voltage, applied to an element which causes the resonance frequency of an oscillating circuit of the oscillator to vary by acting like an instantaneous adjustment variable capacitor (locally linear behaviour of the VCO). It will be noted in FIG. 3 that this variable DC voltage corresponds to control voltage U).

Divider 60 is arranged to supply a signal X3 at a low frequency f3, so that frequency f3 is equal to frequency f2 divided by a predetermined division factor N. For this purpose, divider 60 includes an input terminal 601 connected to terminal 562 of oscillator 56, to receive signal X2, and an output terminal 602 connected to comparator 52, to supply signal X3.

Typically, divider 60 is preferably made by forming a pre-divider with two modules operating at a very high frequency, this pre-divider being known in the art. It is to be noted that the nominal value N0 of division factor N is fixed by frequencies f0 and f1, and is constant at a given temperature To (for example 25° C.). By way of example, in the event that frequencies f1 and f0 are equal respectively to 32 Khz and 434 MHz, value N0 is of the order of 13562.

Comparator 52 is arranged to compare frequency f3 to frequency f1 and, in response to this comparison, to supply two control signals DOWN and UP. Comparator 52 can thus be arranged so that, when frequency f3 is substantially greater than frequency f1, signals DOWN and UP are equal respectively to a high level <<1>> and to a low level <<0>> and that, when frequency f3 is substantially less than frequency f1, signals DOWN and UP are equal respectively to level <<0>> and to level <<1>> (the expressions <<substantially less than>> and <<substantially greater than>> being defined hereinafter). For this purpose, comparator 52 includes an input terminal 521 connected to reference oscillator 51, to receive signal X1, and a second input terminal 522 connected to terminal 602 of divider 60, to receive signal X3. Comparator 52 further includes two output terminals 523 and 524, to supply respectively control signals DOWN and UP.

It will be noted (in particular in FIGS. 9 and 10) that the signals DOWN and UP are not simultaneously equal to level <<0>> and thus include glitches able to cause phase noise.

Preferably comparator 52 is made using a phase and frequency comparator known in the technical field concerned, and described in particular in <<Modern Communication Circuits>> by J. Smith, Editions Mac Graw-Hill, ISBN 0-07-066-544-3, p.308.

Reference oscillator 51 is arranged to include crystal 51a of the clockwork system, so as to supply signal X1 at frequency f1. For this purpose, reference oscillator 51 includes a supply terminal (not shown in FIG. 3) to supply electric power to crystal 51a, and an output terminal 511 connected to terminal 521 of comparator 52, to supply signal X1.

Preferably, the making of reference oscillator 51 from crystal 51a is known in the art, and is described in particular in Swiss Patent Nos. 640,693 and 631,047.

Those skilled in the art will note that a variation of 1 over division factor N means a variation of 32 Khz (which corresponds to the value of frequency f1 supplied as the desired value to comparator 52) during the comparison of frequency f3, which defines the resolution of generator 50.

Indicator supply means 58 is arranged to supply an indicator (designated LCK) containing the state of the control loop. Indeed, this control loop can have two distinct states. One state called the <<locking>> state corresponds to the fact that high frequency f2 is <<substantially equal>> to nominal frequency f0 (which is equivalent to the fact that frequency f3 is <<substantially equal>> to frequency f1). A state called the <<non-locking>> state corresponds to the fact that high frequency f2 is not <<substantially equal>> to nominal frequency f0 (which is equivalent to the fact that frequency f3 is not <<substantially equal>> to frequency f1).

As FIG. 3 shows, indicator supply means or lock detector is 58 arranged to receive signals X1 and X3 and, in response supply indicator LCK so that, when the frequency difference f3−f1 is less (or respectively greater) than value f1*Δf/f, indicator LCK has a value <<1>> (<<0>> respectively). For this purpose, indicator supply means 58 include two input terminals 581 and 582 connected respectively to the output terminal 511 of reference oscillator 51 and to terminal 602 of divider 60, to receive respectively signals X1 and X3, and an output terminal 583 connected to filter 54, to supply indicator LCK.

It is to be noted that frequency f3 is comprised between f1(1−Δf/f) and f1(1+Δf/f), which defines a frequency range within which frequency f3 is called <<substantially equal>> to desired frequency f1. In other words, the expression <<substantially equal>> has the same meaning at the low frequencies as at the high frequencies.

It is to be noted that frequency comparator 52, divider 60 and indicator supply means 58 may be formed by a component sold on the market by Fujitsu under the reference MB15A16.

Filter 54 is arranged to receive indicator LCK and control signals DOWN and UP, to convert these signals and, in response, supply DC control voltage U, so that filter 54 has a narrow band (or respectively wide band), when the control loop is (or respectively is not) locked. In the present case, the band of filter 54 is narrow (respectively wide), when indicator LCK has a value <<1>> (respectively <<0>>). For this purpose, filter 54 includes two input terminals 541 and 542 connected respectively to terminals 523 and 524 of comparator 52, to receive respectively signals DOWN and UP, and an input terminals 543 connected to indicator supply means 58, to receive indicator LCK. Filter 54 also includes an output terminal 544 connected to terminal 561 of oscillator 56, to supply control voltage U.

Filter 54 will now be described in detail, with reference to FIGS. 4 to 6. It is to be noted that the elements of filter 54 described in relation to FIG. 3 have been designated by the same references.

As FIG. 4 shows, filter 54 includes a low-pass filter 62 and control means 64 able to supply a control current I, so that the cut-off frequency of low-pass filter 62 depends on control current I.

Control means 64 are arranged to receive indication LCK and control signals DOWN and UP and, in response, to supply control current I. For this purpose, control means 64 include three input terminals 641 to 643 connected respectively to terminals 541 to 543 of filter 54, to receive respectively control signals DOWN and UP and indicator LCK, and an output terminal 644 connected to low-pass filter 62, to supply control current I.

Figure 5:
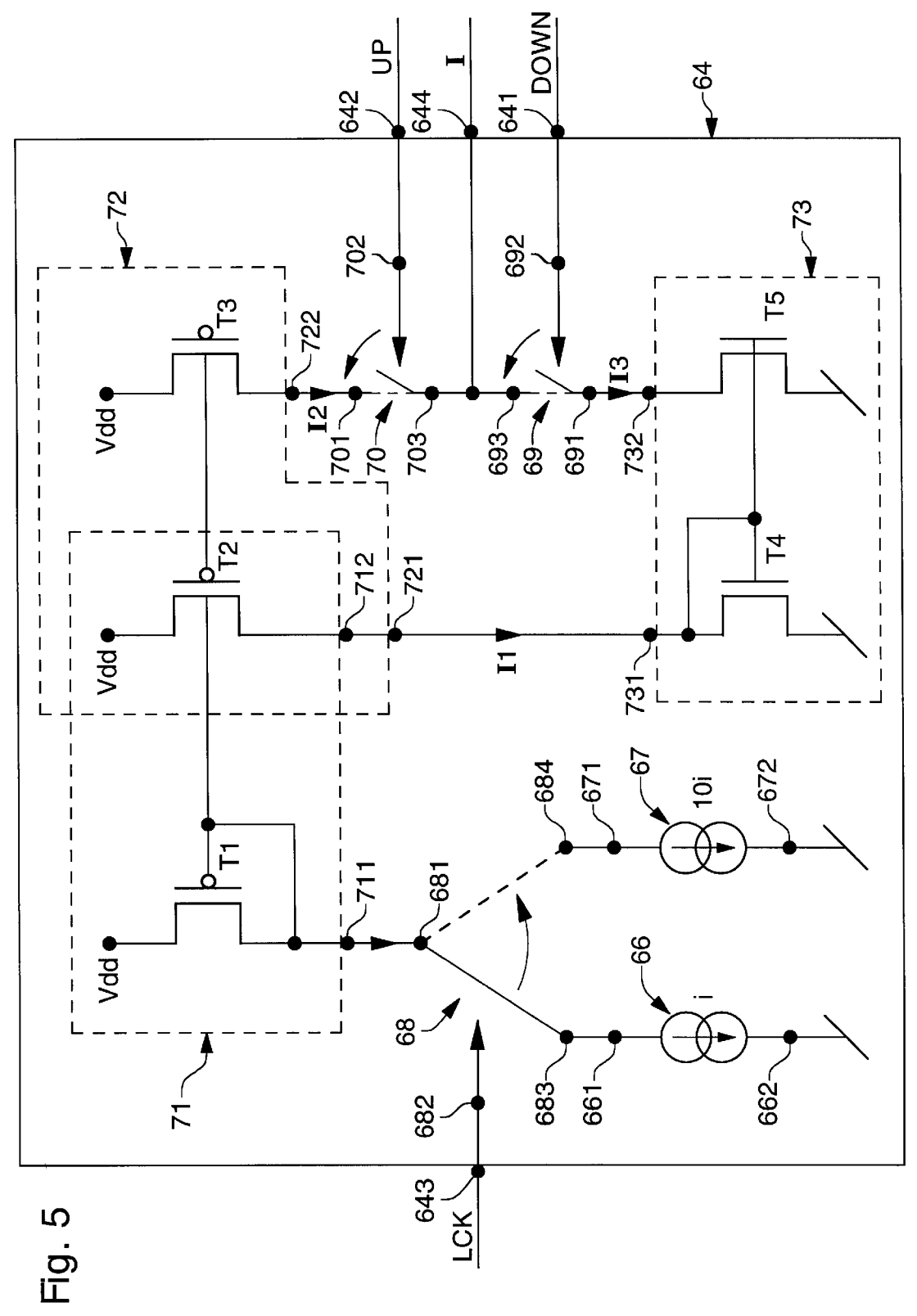

As FIG. 5 shows in more detail, control means 64 include two current sources 66 and 67, three switches 68 to 70, and three current mirrors 71 to 73.

Current source 66 is arranged to supply a current i. For this purpose, current source 66 includes a supply terminal 661 connected to switch 68, to supply current i, and an earth terminal 662 connected to the system's earth. Current source 67 is arranged to supply a current 10i. For this purpose, current source 67 includes a supply terminal 671 connected to switch 68, to supply current 10$i$, and an earth terminal 672 connected to the system's earth. Typically, each of current sources 66 and 67 is preferably made from a conventional temperature insensitive reference source.

Switch 68 includes an input terminal 681 connected to current mirror 71, a control terminal 682 connected to terminal 643 of control means 64, to receive indicator LCK, and two output terminals 683 and 684 connected respectively to terminal 661 of source 66 and to terminal 671 of source 67. Switch 68 is arranged to connect terminal 681 to terminal 683 (respectively to terminal 684) when indicator LCK has a value <<1>> (<<0>> respectively). Typically, switch 68 is preferably made from two transistors controlled in phase opposition.

Current mirror 71 includes an input terminal 711 connected to terminal 681 of switch 68, to supply current i (current 10$i$ respectively), and an output terminal 712, to supply a current I1. Current mirror 71 is arranged so that current I1 is a copy of current i (respectively of current 10$i$). Typically, current mirror 71 is preferably made from two P channel MOS type transistors T1 and T2, the arrangement of these transistors being assumed to be known.

Current mirror 72 includes a terminal 721 connected to terminal 712 of current mirror 71, to supply current I1, and an output terminal 722, to supply a current I2. Current mirror 72 is arranged so that current I2 is a copy of current I1. Typically, current mirror 72 is preferably made from transistor T2 and a P channel MOS type transistor T3, the arrangement of these transistors being assumed to be known.

Current mirror 73 includes a terminal 731 connected to terminal 712 of current mirror 71, to receive current I1, and an output terminal 732, to receive a current I3. Current mirror 73 is arranged so that current I3 is a copy of current I1. Typically, current mirror 73 is preferably made from two N channel MOS type transistors T4 and T5, the arrangement of these transistors being assumed to be known.

Switch 69 includes an input terminal 691 connected to terminal 732 of current mirror 73, to receive signal I3, a control terminal 692 connected to terminal 641 of control means 64, to receive control signal DOWN, and an output terminal 693 connected to terminal 644 of control means 64, to be able to supply current I. Switch 69 is arranged to connect (respectively not to connect) terminal 691 to terminal 693, when control signal DOWN has a value <<1>> (<<0>> respectively). Typically, switch 69 is preferably made from an N channel MOS type transistor.

Switch 70 includes an input terminal 701 connected to terminal 722 of current mirror 72 to receive signal I2, a control terminal 702 connected to terminal 642 of control means 64, to receive control signal UP, and an output terminal 703 connected to terminal 644 of control means 64, to be able to receive current I. Switch 70 is arranged to connect (respectively not to connect) terminal 701 to terminal 703, when control signal UP has a value <<1>> (<<0>> respectively). Typically, switch 70 is preferably made from a P channel MOS type transistor.

It is to be noted that control current I corresponds to a current flux whose amplitude (<<10$i$>> or <<$i$>>) depends upon the value of indicator LCK, and whose direction of flow depends upon the values of control signals DOWN and UP (the signs <<+>> and <<->> representing an injection of current I from means 64 to filter 62, and from filter 62 to means 64 respectively). It is also to be noted that control current I causes the supply of control voltage U in the form of a DC voltage without phase noise.

Low-pass filter 62 is arranged to receive control current I, to have a cut-off frequency representative of current I and, in response, to supply control voltage U. For this purpose, low-pass filter 62 includes a terminal 621 connected to control means 64, to receive control current I, and a terminal 622 connected to output terminal 544 of filter 54, to supply voltage U.

Typically, low-pass filter 62 is preferably made from two capacitors C1 and C2 and from a resistor R1. As FIG. 4 shows, capacitor C2 is connected between terminal 621 and the system's earth, and capacitor C1 is connected in series with resistor R1 between terminal 621 and the system's earth.

The operation of filter 54 will now be briefly described, in combination with comparator 52, with reference to FIG. 6, which shows a curve 61 illustrating the relationship between the efficient value left of control current I, and the frequency difference f3–f1. It is to be noted that curve 61 is shown in logarithmic scale, and that it includes five segments corresponding to five frequency ranges <<A>> to <<E>> described hereinafter.

When frequency difference f3–f1 is less than –f1*Δf/f (range <<A>>), value Ieff has a value +10$i$. Likewise, when frequency difference f3–f1 is greater than +f1*Δf/f (range <<B>>), value Ieff equals –10$i$. It is to be noted that ranges <<A>> and <<B>> correspond to the case in which the control loop is not locked.

When frequency difference f3–f1 is comprised between –f1*Δf/f and +f1*Δf/f, value Ieff passes continuously from +10$i$ to –.10$i$. It is to be noted that comparator 52 supplies mainly a frequency comparison over ranges <<C>> and <<E>>, and a phase comparison over range <<D>>, which is reflected respectively by a steep slope and a gentle slope. It is also to be noted that ranges <<C>> to <<E>> correspond to the case in which frequency f3 is <<substantially equal>> to frequency f1, i.e. to the case in which the control loop is locked.

By way of improvement, the high frequency signal generator according to the present invention can be fitted with a heat compensation device.

Indeed, it will be recalled that the real frequency f1 supplied by crystal 51$a$ of reference oscillator 51 changes over time and also under the influence of variations in the ambient temperature. For example, for a clockwork oscillator whose crystal vibrates at its nominal frequency at a temperature To of 25° C., the error of this frequency can reach 60 ppm in a temperature range of –10 to +50° C.

For the heat compensation of a time base such as that of the clockwork system fitted with the generator according to the present invention, several compensation circuits have been proposed in the state of the art concerned, in particular in U.S. Pat. No. 4,761,771 or Swiss Patent No. 650, 122.

A second preferred embodiment of a generator according to the present invention will now be described with reference to FIG. 7 which shows a generator 76 able to perform heat compensation of frequency f2 supplied by oscillator 56. The elements of generator 76 which are identical to those of generator 50 of FIG. 3 have been designated by the same references.

Figure 7:
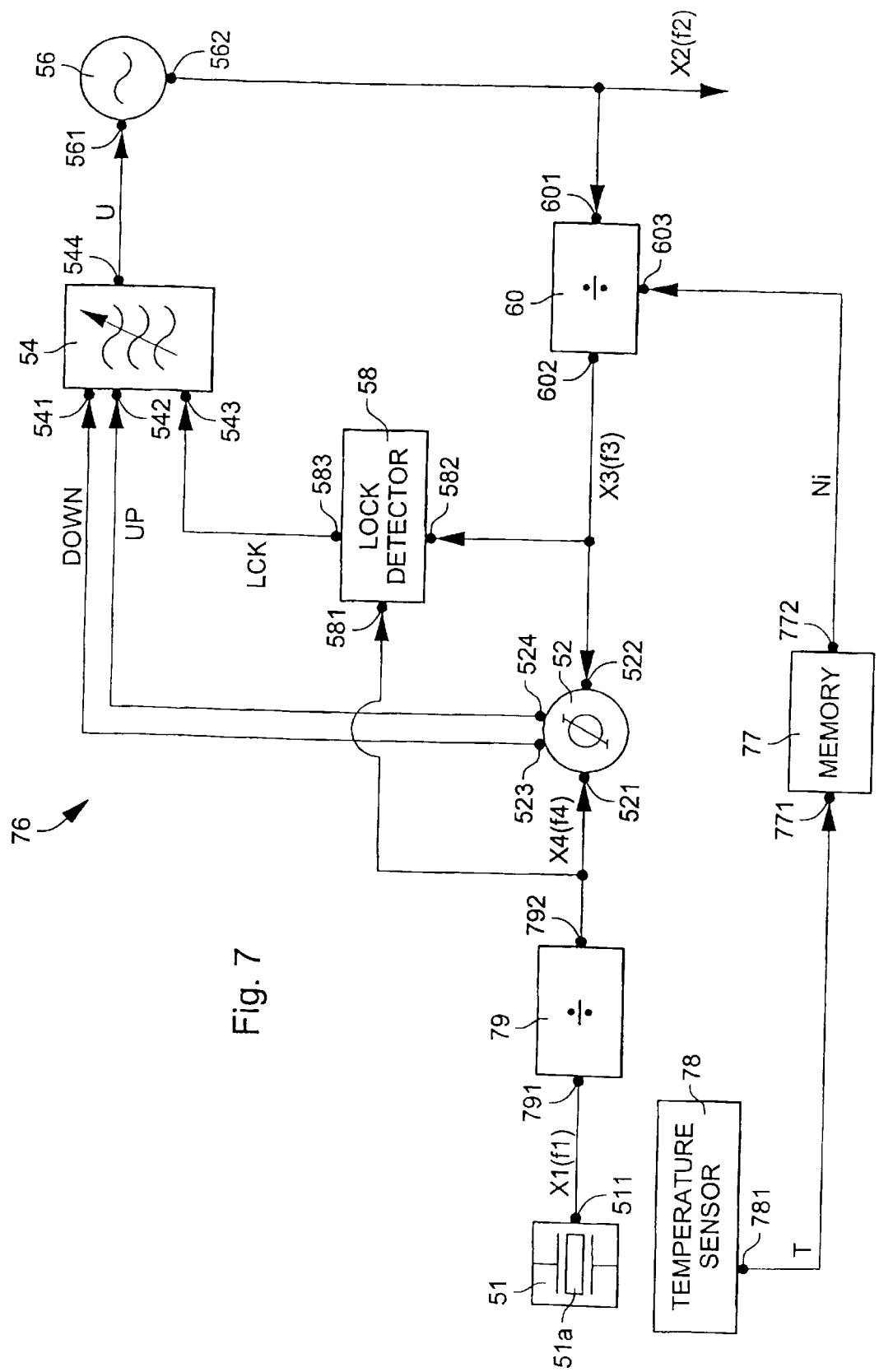
FIG. 7 shows a second preferred embodiment of a high frequency signal generator according to the present invention.
Figure 9A:
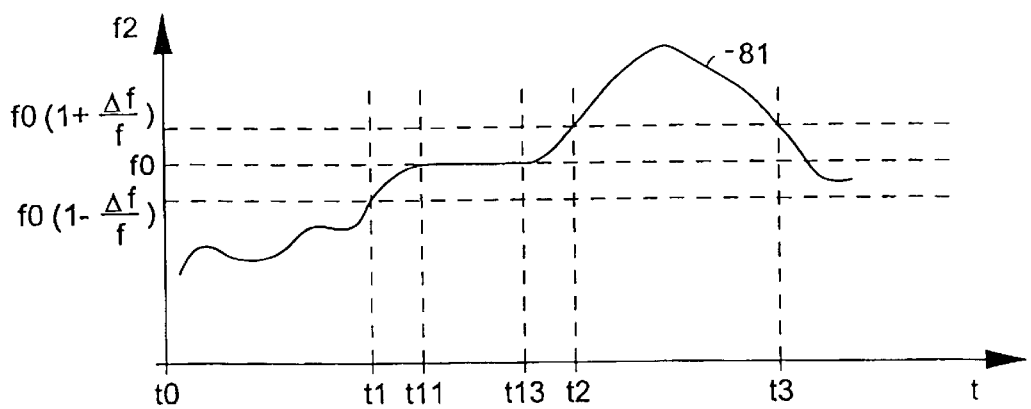
FIGS. 9A–9D show four timing diagrams associated with the operation of the generator of FIG. 3.
Figure 9B:
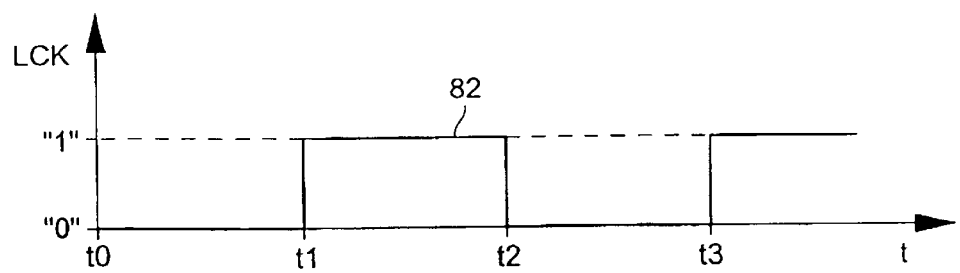
Figure 9C:
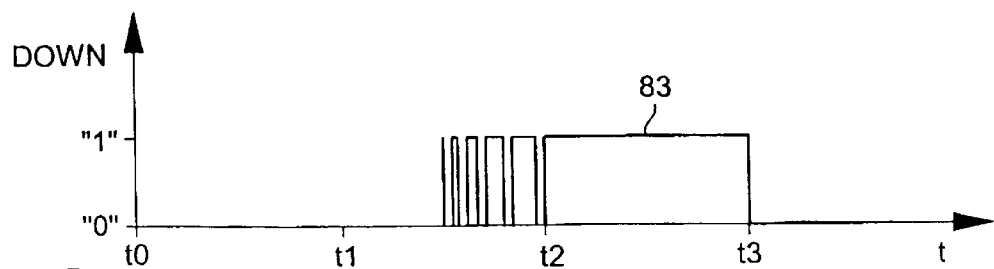
Figure 9D:
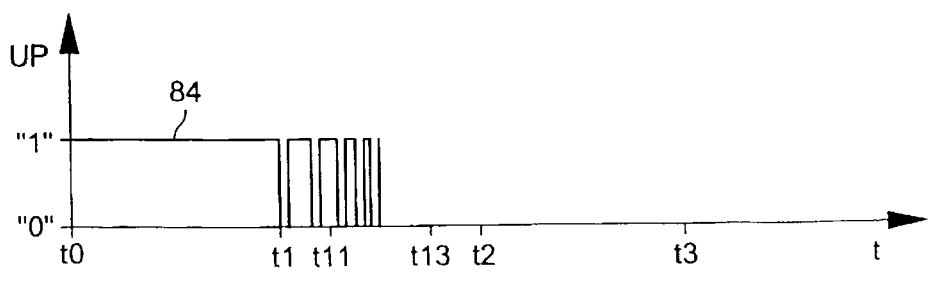

As FIG. 7 shows, generator 76 further includes a memory 77 and a temperature sensor 78.

Sensor 78 is arranged to measure the ambient temperature (i.e. that of crystal 51$a$ and the different components of generator 76) and to supply a measurement value T of this temperature. For this purpose, sensor 78 is arranged in proximity to crystal 51*a*, and includes an output terminal 781 connected to memory 77, to supply measurement value T.

Typically, the temperature sensor is made using a negative temperature coefficient (NTC) resistor.

Memory 77 is arranged to contain a correspondence table between first values Ti of the ambient temperature and values Ni of division factor N. For this purpose, memory 77 includes an input terminal 771 connected to terminal 781 of sensor 78, to receive measurement value T, and an output terminal 772 connected to a control terminal 603 of divider 60, to supply the latter with the value Ni corresponding to the value Ti which is the closest to measurement value T, according to the correspondence table.

Figure 1:
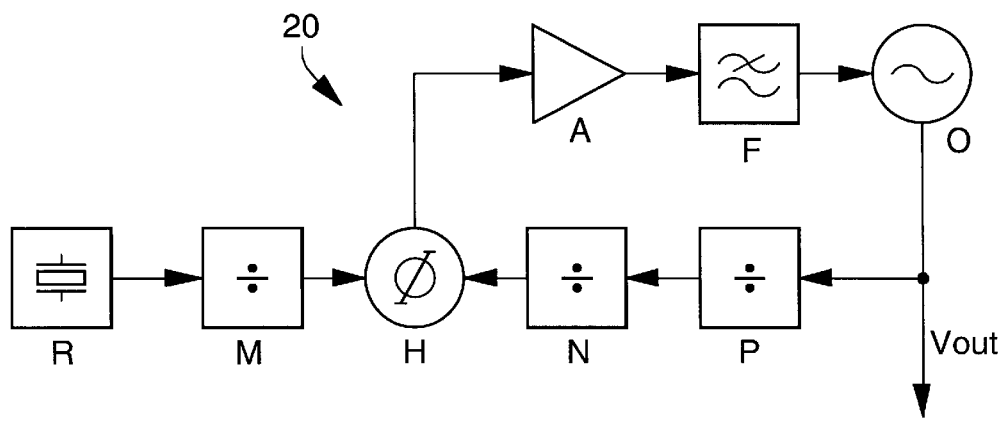
FIG. 1, which has already been cited, shows a conventional high frequency signal generator.
Figure 2:
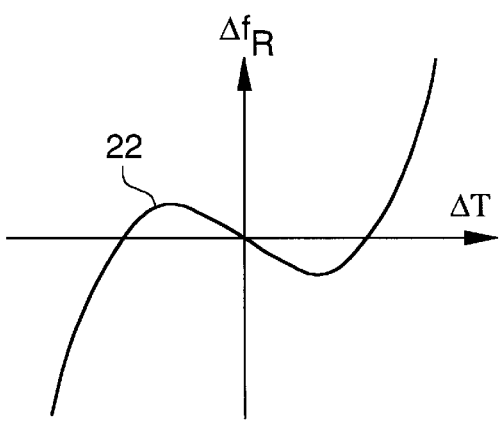
FIG. 2, which has already been cited, shows a curve illustrating the relationship between a temperature and a frequency variation, associated with an AT crystal.
Figure 8:
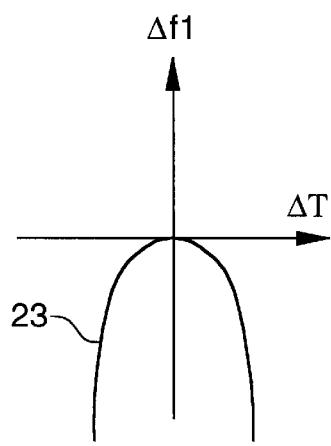
FIG. 8 shows a curve illustrating the relationship between a temperature and a frequency variation, associated with a CT crystal.

Typically, memory 77 is preferably made using a known EEPROM type memory. The correspondence table is adapted for frequency lock to frequency fo equal to 434 Mhz, and is assumed to be known from calibration of crystal 51*a*. Such calibration consists in determining, from measurements made at three different temperature values, the parametric coefficients of a parabola belonging to crystal 51*a*. By way of illustration, FIG. 8 shows a curve 23 illustrating the temperature dependence of frequency f1 supplied by crystal 51*a*. As FIG. 8 shows, a variation in temperature ΔT causes a frequency variation Δf4 on crystal CT, in accordance with a quadratic type function. It is to be noted that curve 23 allows frequency values f1i of crystal 51*a* corresponding to values Ti to be determined, and that values Ni contained in the correspondence table are equal to (N0*f1/f1i).

Those skilled in the art will note that such a characterisation of crystal 51*a* allows a temperature and frequency calibration of the crystal to be provided, i.e. the position of the peak of parabolic curve 23 to be determined. Indeed, the position of this peak can vary between two crystals of the same type, so that the corresponding frequency precision is comprised between 0 and 60 ppm. Thus, generator 76 which performs a heat compensation also performs frequency calibration.

By way of improvement, as FIG. 7 shows, generator 76 can include a divider 79 connected between reference oscillator 51 and comparator 52, and arranged to provide the latter with a signal X4 at a frequency f4 (for example 4 Khz) which is equal to frequency f1 (i.e. 32 Khz) divided by a division factor N2 (for example 8). For this purpose, divider 79 includes an input terminal 791 connected to terminal 511 of reference oscillator 51, and an output terminal 792 connected to terminal 521 of comparator 52. Typically, divider 79 is preferably made using a known divider circuit.

Those skilled in the art will note that one advantage of the arrangement of divider 59 is that it provides frequency f4 (i.e. a desired value less than frequency f1), which gives generator 76 improved resolution. Indeed, a variation of 1 over division factor N means a variation of 4 Khz (i.e. frequency f4 supplied to comparator 52) during comparison of frequency f3.

The operation of generator 50 will now be described with reference to FIG. 9 which shows four timing diagrams 81 to 84, as well as the operation of generator 76 with reference to FIG. 10 which shows five timing diagrams 91 to 95.

It will be noted that FIG. 9 illustrates the frequency lock of frequency f2 at nominal frequency f0, without taking account of a temperature variation, while FIG. 10 illustrates the frequency lock of frequency f2 at nominal frequency f0, following a temperature variation.

With reference to FIG. 9, it is to be noted that timing diagrams 81 to 84 are associated respectively with frequency f2 and signals LCK, DOWN and UP.

Let us consider the time interval comprised between an initial instant t0 and an instant t1, during which frequency f2 is less than f0*(1−Δf/f). As a result, frequency f3 is less than f1*(1−Δf/f). In other words, the control loop is not locked and this situation corresponds to case <<A>> of FIG. 6. Thus, indicator LCK has a value <<0>>, control signal DOWN has a value <<0>> and control signal <<UP>> has a value <<1>>. It follows that the value leff equals +10*i*, and frequency f2 supplied by reference oscillator 51 tends to increase towards nominal frequency f0.

Let us consider the time interval comprised between instant t1 and an instant t2, during which frequency f2 is greater than f0*(1−Δf/f), but less than f0*(1+Δf/f). As a result, frequency f3 is greater than f1*(1−Δf/f), but less than f1*(1+Δf/f). In other words, the control loop is locked, and this situation corresponds to cases <<C>> to <<E>> of FIG. 6 (it is to be noted that the time interval comprised between instants t11 and t13 correspond to case <<D>> of FIG. 6). Thus, indicator LCK has a value <<1>>, control signal DOWN has a value <<0>> and control signal UP has a value <<1>>. It follows that frequency f2 is substantially equal to nominal frequency f0.

Let us consider the time interval comprised between instant t2 and an instant t3, during which frequency f2 is greater than f0*(1+Δf/f). As a result, frequency f3 is greater than f1*(1+Δf/f). In other words, the control loop is not locked, and this situation corresponds to case <<B>> of FIG. 6). Thus, indicator LCK has a value <<0>>, control signal DOWN has a value <<1>> and control signal UP has a value <<0>>. It follows that value leff is equal to +10*i*, and that frequency f2 supplied by reference oscillator 51 tends to decrease towards nominal frequency f0.

With reference to FIG. 10, it is to be noted that timing diagrams 91 to 95 are associated respectively with ambient temperature T, with division factor N and signals UP, DOWN and LCK. It will be assumed, in the following description, that the control loop is locked, i.e. the locking state is maintained by generator 76. Thus, signals UP and DOWN equal <<0>> (and include glitches), and indicator LCK has a value <<1>>).

Let us consider an initial instant t4 when temperature T is equal to 25° C. According to the hypothesis, at instant t4, frequency f2 is substantially equal to nominal frequency f0, and division factor N is equal to nominal value N0. In other words, values f1, N0 and f0 are linked by the relationship: N0*f1=f0.

Let us assume that, starting from instant t4, temperature T begins to increase and reaches at an instant t45 the value Ti. It follows, according to curve 23 of FIG. 8, that frequency f1 supplied by crystal 51*a* begins to decrease, i.e. is equal to a value f1i less than frequency f1 (but greater than f1*(1−Δf/f), according to the hypothesis). It also follows that sensor 78 supplies memory 77 with temperature value Ti. In response, memory 77 supplies divider 60 with the value Ni corresponding to value Ti, i.e. Ni=N0*f1/f1i. Consequently, frequency f3 becomes equal to f1i, since N0*f1=f0. And comparator 52 thus receives signals X1 and X3 whose frequencies each have a value f1i. As a result, frequency f2 is substantially equal to nominal frequency f0.

In the time interval comprised between instants t4 and t5, temperature T increases, and the situation is similar to that at instant t4, so that frequency f2 continues to be equal to nominal frequency f0.

In the time interval comprised between instant t5 and an instant t6, temperature T decreases. It follows, according to curve 23 of FIG. 8, that frequency f1 supplied by crystal 51*a* begins to increase. The situation is symmetrical with that at instant t4, so that frequency f2 continues to be substantially equal to nominal frequency f0.

It goes without saying for those skilled in the art that the detailed description hereinbefore can undergo various modifications without departing from the scope of the present invention. By way of example, and with reference to FIG. 3, divider 60 can be fitted with a memory containing several values of division factor N which correspond to several values of nominal frequency f0, so that generator 50 fitted therewith can be used with several transmission channels.

What is claimed is:

1. A high frequency signal generator fitted to a clockwork system including a clockwork crystal used as a time base, this generator including:
    a first oscillator supplying a first signal at a low frequency first frequency;
    a second oscillator receiving a control voltage and, in response, supplying a second signal at a high frequency second frequency;
    a first divider receiving said second signal, and supplying a third signal at a low frequency third frequency equal to said second frequency divided by a first division factor;
    a frequency comparator comparing said third frequency and said first frequency and, in response, supplying first and second control signals, and
    a control loop including a filter receiving said control signals, and, in response, supplying said control voltage to cause the supply of said second frequency at a nominal frequency, wherein:
        said first oscillator includes said clockwork crystal, so that the latter supplies said first signal at a low frequency to said comparator;
        said generator also includes indicator means supplying, as a function of said first and third frequencies, an indicator containing the state of said control loop; and
        said filter includes control means receiving said indicator, and, in response, supplying a control current with an amplitude depending on the state of said control loop, said filter having a narrow band with a first control current when said control loop is locked and having a wide band with a second current greater than said first current when said control loop is not locked.

2. A generator according to claim 1, wherein said control means are arranged so that said control current has an intensity dependent on said indicator, and a direction of flow dependent on said first and second control signals, and wherein said filter is arranged so that the cut-off frequency depends on said control current.

3. A generator according to claim 1, wherein said indicator supply means are arranged so that said indicator is equal to a high level, respectively to a low level, when the frequency difference between said third and first frequencies is less than, or respectively greater than, a predetermined value.

4. A generator according to claim 1, wherein:
    said frequency comparator is arranged so that said first and second control signals are equal respectively to: a first high level and a low level, when said third frequency is substantially greater than said first frequency; and conversely, when said third frequency is substantially less than said first frequency; and wherein
    said filter is arranged so that the efficient value of said control current is equal to: a first positive high value when said first and second control signals are equal respectively to said high level and to said low level; and to a second negative high value when said first and second control signals are equal respectively to said low level and to said high level.

5. A generator according to claim 2, wherein said filter includes a first capacitor, a second capacitor and a resistor arranged to form a low-pass filter receiving control current from control means.

6. A generator according to claim 1, further including a heat compensation device including:
    a temperature sensor arranged in the vicinity of said crystal for supplying a measurement value of the temperature; and
    a first memory containing a correspondence table between temperature values and first division factor values, said first memory receiving said measurement value and, in response, supplying said first divider with the first division factor value which, according to said correspondence table, corresponds to the temperature value closest to said measurement value.

7. A generator according to claim 6, wherein said correspondence table is adapted to said nominal frequency and known from calibration of said crystal.

8. A generator according to claim 6, further including a second divider connected between said first oscillator and said comparator, and supplying a fourth signal at a low frequency fourth frequency, so that this latter is equal to said first frequency divided by a second division factor.

9. A generator according to claim 1, wherein said first division factor depends on said nominal frequency and on the temperature.

10. A generator according to claim 1, including a second memory containing a plurality of first division factor values associated with a plurality of nominal frequency values, and with a predetermined temperature value, so that said generator can be used with a plurality of transmission channels associated respectively with the plurality of nominal frequency values.

11. A generator according to claim 1, wherein said crystal is of the CT type, and said first frequency is equal to 32768 Hz.

12. A high frequency signal generator fitted to a clockwork system including a crystal used as a time base, this generator including:
    a first oscillator supplying a first signal at a low frequency first frequency;
    a second oscillator receiving a control voltage and, in response, supplying a second signal at a high frequency second frequency;
    a first divider receiving said second signal, and supplying a third signal at a low frequency third frequency equal to said second frequency divided by a first division factor;
    a frequency comparator comparing said third frequency and said first frequency and, in response, supplying first and second control signals, and
    a control loop including a filter receiving said control signals and, in response supplying said control voltage to cause the supply of said second frequency at a nominal frequency, wherein:
        said first oscillator includes the same clockwork crystal, so that the latter supplies said first signal;
        said generator also includes indicator means supplying, as a function of said first and third frequencies, an indicator containing the state of said control loop;

said filter includes control means receiving said indicator and, in response, supplying a control current, so that said filter has a narrow, or respectively wide band, when said control loop is, or respectively is not, locked;

a temperature sensor arranged in the vicinity of said crystal for supplying a measurement value of the temperature; and a first memory containing a correspondence table between temperature values and first division factor values, said first memory receiving said measurement value, and, in response, supplying said first divider with the first division factor value which, according to said correspondence table, corresponds to the temperature value closest to said measurement value.

13. A generator according to claim 12, wherein said correspondence table is adapted to said nominal frequency and known from calibration of said crystal.

14. A generator according to claim 12, further including a second divider connected between said first oscillator and said comparator, and supplying a fourth signal at a low frequency fourth frequency, so that this latter is equal to said first frequency divided by said second division factor.

15. A high frequency signal generator fitted to a clockwork system, in particular a wristwatch, including a clockwork crystal used as a time base, this generator including:

a first oscillator supplying a first signal at a low frequency first frequency in particular under 100 kHz;

a second oscillator receiving a control voltage and, in response, supplying a second signal at a high frequency second frequency;

a first divider receiving said second signal, and supplying a third signal at a low frequency third frequency equal to said second frequency divided by a first division factor;

a frequency comparator comparing said third frequency and said first frequency and, in response, supplying first and second control signals, and a control loop including a filter receiving said control signals and, in response supplying said control voltage to cause the supply of said second frequency at a nominal frequency, wherein:

said first oscillator includes said clockwork crystal, so that the latter supplies said first signal at a low frequency to said comparator;

said generator also includes indicator means supplying, as a function of said first and third frequencies, an indicator containing the state of said control loop; and said filter includes control means receiving said indicator and, in response, supplying a control current with an amplitude depending on the state of said control loop, said filter having a narrow band with a first control current when said control loop is locked and having a wide band with a second current greater than said first current when said control loop is not locked.

16. A generator according to claim 15, wherein said crystal is of the CT type, and said first frequency is equal to 32768 Hz.

17. A generator according to claim 15, further including a heat compensation device including:

a temperature sensor arranged in the vicinity of said crystal for supplying a measurement value of the temperature; and a first memory containing a correspondence table between temperature values and first division factor values, said first memory receiving said measurement value and, in response, supplying said first divider with the first division factor value which, according to said correspondence table, corresponds to the temperature value closest to said measurement value.

* * * * *